United States Patent [19]

Inoue

[11] 4,323,866

[45] Apr. 6, 1982

[54] FILTER CIRCUIT

[75] Inventor: Jiro Inoue, Kanazawa, Japan

[73] Assignee: Murata Manufacturing Co., Ltd., Japan

[21] Appl. No.: 147,720

[22] Filed: May 8, 1980

[30] Foreign Application Priority Data

May 24, 1979 [JP] Japan ............................. 54-69747[U]

[51] Int. Cl.$^3$ ........................ H03H 9/52; H03H 9/56; H03H 9/60

[52] U.S. Cl. .................................. 333/188; 333/191; 333/192

[58] Field of Search ............................... 333/187–189, 333/191, 192; 310/317–321, 365–366; 455/150, 188, 191, 195, 199, 266, 286, 296–297, 339

[56] References Cited

U.S. PATENT DOCUMENTS 3,956,719  5/1976  Waku et al. ........................... 333/188

Primary Examiner—Marvin L. Nussbaum
Attorney, Agent, or Firm—Ostrolenk, Faber, Gerb & Soffen

[57] ABSTRACT

A first three-terminal type ceramic filter is connected to receive an intermediate frequency signal at the input electrode thereof. A first capacitor is connected between the output electrode of the first three-terminal type ceramic filter and the input electrode of a second three-terminal type ceramic filter while the common electrodes of both filters are connected to ground. A second capacitor can be selectively connected in parallel with the first capacitor to within the passband. When the second capacitor is so connected, an inductor is simultaneously connected between the input terminal of the second ceramic filter and ground to offset the passband central-frequency shift caused by connection of the second capacitor. A transistor is preferably used as a switching element to connect the second capacitor and the inductor.

2 Claims, 5 Drawing Figures

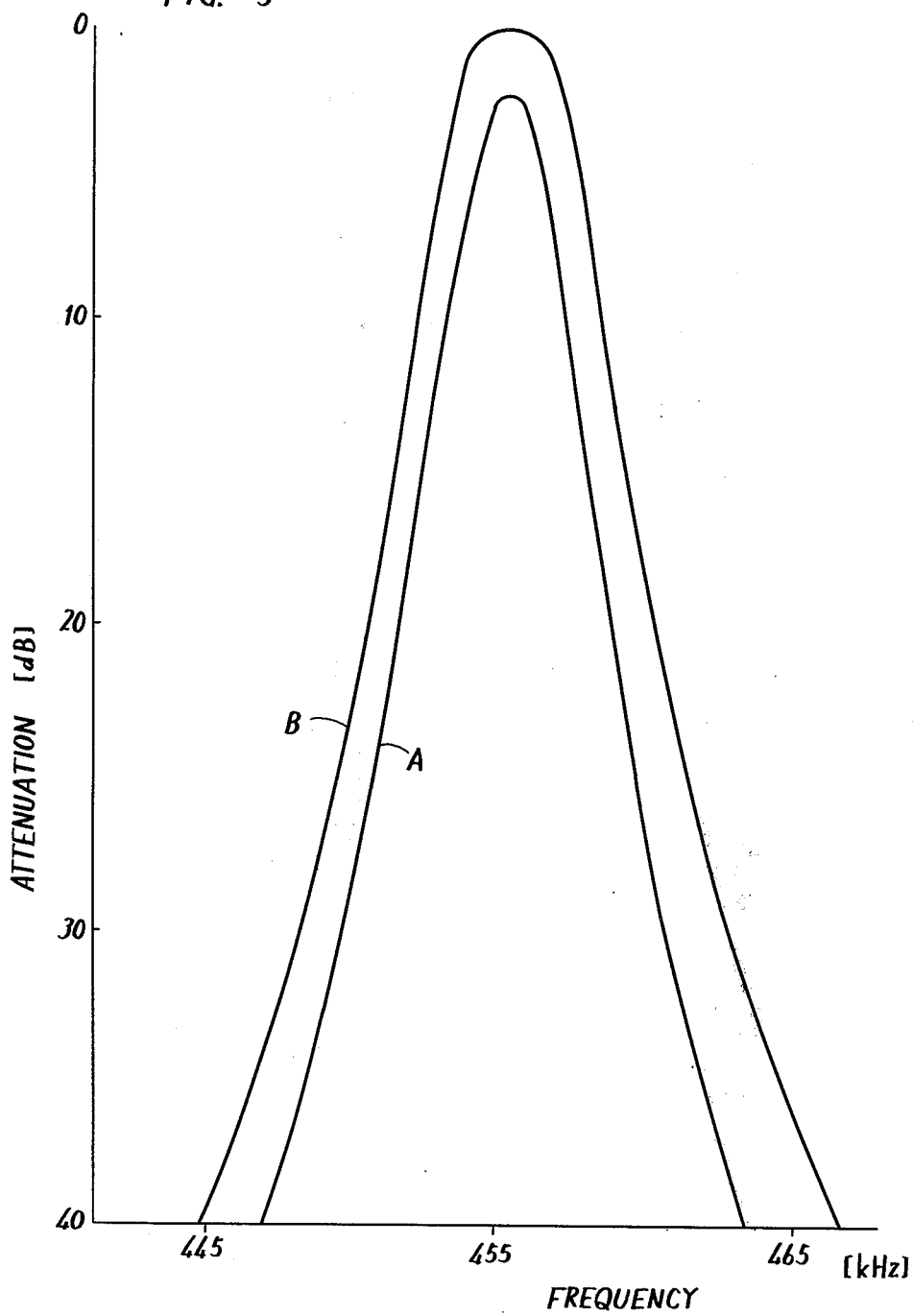

FILTER CIRCUIT

BACKGROUND OF THE INVENTION

1. Field of the Invention

The present invention relates to a filter circuit. More specifically, the present invention relates to a bandpass filter for use in an intermediate frequency amplifier in a radio receiver, for example.

2. Description of the Prior Art

In a radio receiver, for example, it has been proposed that the passband width of a filter circuit for an intermediate frequency signal be changed depending on the conditions of the broadcasting waves, the purposes of reception, and the like on the occasion of reception of the radio broadcasting. For example, a narrow bandpass filter is used to remove an interference noise. A narrow bandpass filter is selected also for tuning to a given broadcasting wave. On the other hand, a wide bandpass filter is used for the purpose of establishing a reception state for passage of an ample sideband to provide a good sound quality.

For the purpose of selectively switching the passband width of a filter circuit to a narrow passband width or a wide passband width, conventionally approaches like those shown in FIGS. 1 and 2 have been employed. More specifically, referring to FIG. 1, a narrow bandpass filter 31 and a wide bandpass filter 32 are disposed between a mixer 1 and an intermediate frequency amplifier 2 of a radio receiver, for example. By means of gang switches 41 and 42, either of the narrow bandpass filter 31 and the wide bandpass filter 32 is selectively connected between the mixer 1 and the intermediate frequency amplifier 2. However, the FIG. 1 structure requires two filters, i.e. the narrow bandpass filter 31 and the wide bandpass filter 32, which makes the cost high. Furthermore, since two filters are switched by means of the switches 41 and 42, it is necessary to make adjustment such that the center frequency f0 of both filters 31 and 32 is consistent.

The FIG. 2 example employs well known three-terminal ceramic filters 51 and 52. The ceramic filters 51 and 52 may be of a type employing a well-known expansion mode vibration. For example, divided electrodes are formed on one main surface of a ceramic plate 51a (52a) including PZT ceramic and a common electrode is formed on the other main surface. One of the divided electrodes is used as an input electrode 51in (52in), while the other is used as an output electrode 51out (52out), the common electrode 51c (52c) being connected to ground, thereby to complete a bandpass filter. A coupling capacitor 61 is inserted between the output electrode 51out of one ceramic filter 51 and the input electrode 52in of the other ceramic filter 52. A second coupling capacitor 62 is provided in parallel with the coupling capacitor 61 such that the second coupling capacitor 62 may be connected in parallel with or disconnected from the coupling capacitor 61 by means of switches 71 and 72. In the case of a narrow passband width, the switches 71 and 72 are opened or turned off, while in case of the width passband width the switches 71 and 72 are turned on or closed. Accordingly, the filter characteristic when the switches 71 and 72 are turned off is shown by the curve A in FIG. 3, while the filter characteristic when the switches 71 and 72 are turned on is shown by the curve B in FIG. 3. As seen from FIG. 3, by turning on or off the switches 71 and 72 the passband width can be selectively changed.

To change the overall passband width by changing the capacitance of a capacitor between two ceramic filters as shown in FIG. 2 is disclosed, for example, in the article entitled "A CERAMIC BANDPASS TRANSFORMER AND FILTER ELEMENT" presented by A. Lungo and F. Sauerland of Clevite Corporation in the IRE International Convention Record, PART 6, issued Mar. 20 to 23, 1961.

However, in the FIG. 2 example, the coupling capacitance is increased when the switches 71 and 72 are turned on, so that the passband width is extending only at the lower frequency side, as shown in FIG. 3, with the result that the center frequency is shifted toward a lower frequency region.

SUMMARY OF THE INVENTION

For the purpose of eliminating the above described various problems and shortcomings of the conventional approaches, the present invention comprises a filter circuit wherein a first capacitor is connected between two three-terminal type ceramic filters in changing the passband width to a narrow passband width and a second capacitor is connected in parallel with the first capacitor. An inductor is connected between the input electrode of the second three-terminal type ceramic filter and the reference potential when the passband width is changed to a wide passband width.

According to the present invention, since the overall capacitance is increased by connecting the second capacitor in parallel with the first capacitor connected between the two three-terminal type ceramic filters, the passband width can be changed from a narrow passband width to a wide passband width. Furthermore since the inductance is connected between the input electrode of the second three-terminal type ceramic filter and the reference potential, the deviation of the center frequency toward a lower frequency region due to the second capacitor is offset toward a higher frequency region. As a result, the deviation of the center frequency toward a lower frequency region due to the second capacitor and the deviation of the center frequency due to the inductor tend to compensate for each other.

Accordingly, a principal object of the present invention is to provide a filter circuit wherein a passband width can be readily changed without deviation of the center frequency.

Another object of the present invention is to provide a filter circuit having a simple circuit configuration wherein the passband width can be changed to a wide passband width or a narrow passband width without deviation of the center frequency.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a graph showing a filter characteristic of one embodiment of the present invention.

DESCRIPTION OF THE PREFERRED EMBODIMENTS

Figure 4:
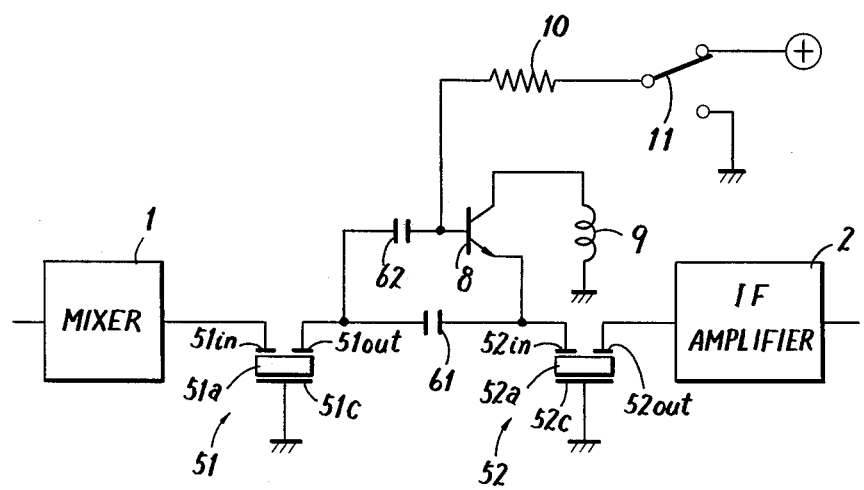
FIG. 4 is a schematic diagram showing one embodiment of the present invention.

FIG. 4 is a schematic diagram showing one embodiment of the present invention. FIG. 5 is a graph showing a filter characteristic of the FIG. 4 embodiment. The embodiment shown is an example of a filter circuit structured as an intermediate frequency filter for use in a radio receiver, for example. Accordingly, an intermediate frequency signal from a mixer 1 is transferred to an intermediate frequency amplifier 2 through two-three-terminal type ceramic filters 51 and 52 connected in series by means of a first coupling capacitor 61. The terminal of the coupling capacitor 61 which is connected to the output electrode 51 out of one ceramic filter 51 is connected to one terminal of a second coupling capacitor 62. The other terminal of the coupling capacitor 61, i.e. the terminal thereof, which is connected to the input electrode 52 in of the other ceramic filter 52, is connected to the emitter of a switching transistor 8, which may be an NPN type as in the case of the embodiment shown or alternatively may be a PNP type. The base of the transistor 8 is connected to the other terminal of the second coupling capacitor 62 and is also connected through a suitable biasing resistor 10 to a switch 11. Switch 11 connects the transistor base alternatively to a voltage source or to ground. Accordingly, by turning the switch 11, a given positive voltage (in the case of the NPN transistor) is applied to the base electrode of the switching transistor 8 or is interrupted. The collector electrode of the transistor 8 is connected to ground through an inductor 9. Now that the structural features of the embodiment have been described in the foregoing, the operation thereof will be described in the following.

If and when the switch 11 is turned to the ground side, the transistor 8 is turned off and the filter circuit is substantially configured as a narrow bandpass filter by means of the ceramic filter 51, the coupling capacitor 61 and the ceramic filter 52, exhibiting a filter characteristic shown by the curve A in FIG. 5.

When the switch 11 is turned to the positive voltage side, the positive voltage is applied through the resistor 10 to the base electrode of the transistor 8, so that the transistor 8 is turned on. Accordingly, the second coupling capacitor 62 is coupled in parallel with the coupling capacitor 61 and the inductor 9 is connected to the input electrode 52 in of ceramic filter 52. Since the second coupling capacitor 62 is added, the passband width of the filter characteristic is expanded toward a lower frequency region as described previously. At the same time, the inductor 9 is added to the circuit, thereby to expand the passband width toward a higher frequency region as compared with the central frequency f0, by properly selecting the inductance value.

Now referring to FIG. 4, assuming for example that the central frequency of the intermediate frequency signal is 455 kHz, the capacitance of the first coupling capacitor 61 is selected to be 22 pF, the capacitance of the second coupling capacitor 62 is selected to be 68 pF, and the inductance of the inductor 9 is selected to be 3 mH, then the passband width can be expanded as an average by 2 kHz both toward a lower frequency region and a higher frequency region with the central frequency f0 in the center. The expanded or widened passband width is shown by the curve B in FIG. 5.

Figure 1:
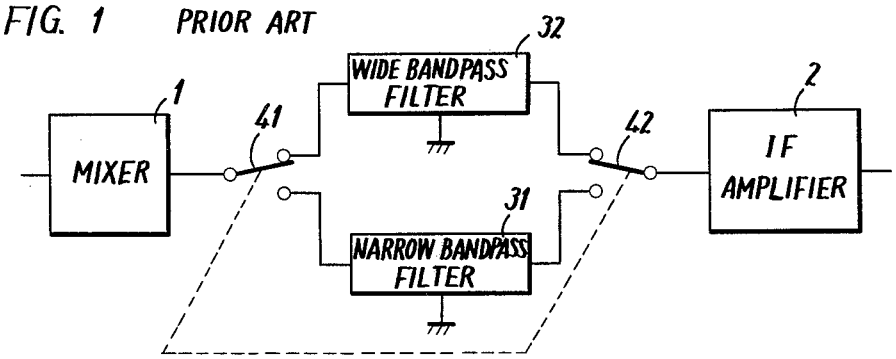
FIGS. 1 and 2 are views showing examples of conventional changeable bandpass filters.
Figure 2:
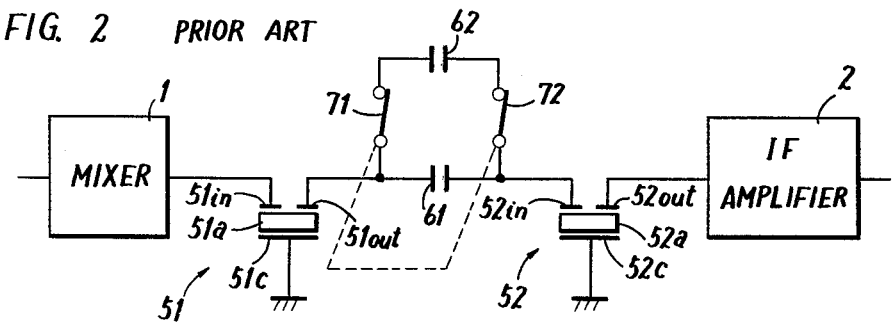
Figure 3:
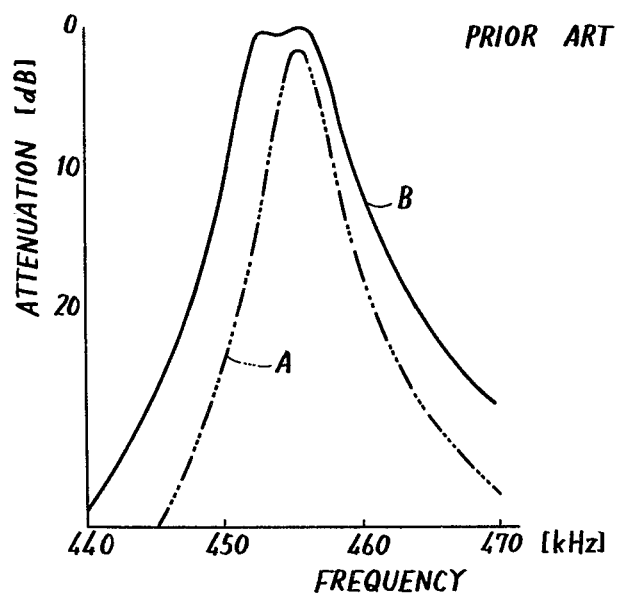
FIG. 3 is a graph showing a filter characteristic of the FIG. 2 example.

According to the FIG. 2 conventional filter circuit, when the capacitance of the coupling capacitor 61 is selected to be 22 pF and the capacitance of the coupling capacitor 62 is selected to be 78 pF, thereby to widen the passband width from a narrow passband width to a wide passband width, the center frequency f0 was shifted by approximately 1 kHz toward a lower frequency region. However, according to the embodiment shown, as apparent from FIG. 5, the deviations of the center frequency f0 are offset by the second coupling capacitor 62 and the inductance 9 and as a result the filter circuit can be switched to exhibit a wider passband width or a narrower passband width without any deviation of the center frequency f0.

The inductor 9 is not limited to the above described value but may be selected to any suitable value in consideration of the desired center frequency f0 and the capacitance of the second capacitor for determining a widened passband width. By selecting the inductance of the inductor to an optimun value, the passband width can be widened without any deviation of the center frequency f0.

Although the present invention has been described and illustrated in detail in connection with one preferred embodiment thereof, it is clearly understood that the same is by way of illustration and example only and is not to be taken by way of limitation, the spirit and scope of the present invention being limited only by the terms of the appended claims.

What is claimed is:

1. A filter circuit, comprising:
  a first three-terminal type ceramic filter including an input electrode, an output electrode, and a common electrode, said input electrode of said first three-terminal type ceramic filter being adapted to receive and input signal and said common electrode of said first three-terminal type ceramic filter being connected to a reference potential;
  a second three-terminal type ceramic filter including an input electrode, an output electrode, and a common electrode, said output electrode of said second three-terminal type ceramic filter outputting an output signal responsive to said first three-terminal type ceramic filter receiving said input signal, and said common electrode of said second three-terminal type ceramic filter being connected to said reference potential;
  a first capacitor having one terminal connected to said output electrode of said first three-terminal type ceramic filter and having another terminal connected to said input electrode of said second three-terminal type ceramic filter;
  a second capacitor;
  an inductor;
  switching means responsive to an enabling signal for selectively connecting said second capacitor between said output electrode of said first three-terminal type ceramic filter and said input electrode of said second three-terminal type ceramic filter and for simultaneously connecting said inductor between said input electrode of said second three-terminal type ceramic filter and said reference potential; and
  said switching means comprising a transistor having a first electrode, a second electrode and a control electrode; said second capacitor having one terminal connected to said output electrode of said first three-terminal type ceramic filter and having another terminal connected to said control electrode of said transistor; said input electrode of said second three-terminal type ceramic filter being connected to said first electrode of said transistor; said inductor being connected between said second electrode of said transistor and said reference potential; and said transistor being rendered conductive upon receipt of said enabling signal by said control electrode when it is desired to connect said second capacitor between said first and second ceramic filters.

2. A filter circuit in accordance with claim 1, wherein a resistor is connected to said control electrode of said transistor and said enabling signal is applied to said control electrode via said resistor.

* * * * *